United States Patent [19]

Muguruma et al.

[11] 4,399,524
[45] Aug. 16, 1983

[54] MEMORY PROTECTION SYSTEM

[75] Inventors: Norio Muguruma, Yao; Mitsuo Morihisa, Nara; Hideyuki Akao, Osaka, all of Japan

[73] Assignee: Sharp Kabushiki Kaisha, Osaka, Japan

[21] Appl. No.: 235,621

[22] Filed: Feb. 18, 1981

[30] Foreign Application Priority Data

Feb. 18, 1980 [JP] Japan .................. 55-20010[U]

[51] Int. Cl.³ .......................................... G11C 7/00
[52] U.S. Cl. ................................... 365/229; 365/228
[58] Field of Search .................. 365/229, 228, 226

[56] References Cited

U.S. PATENT DOCUMENTS

| 3,562,555 | 2/1971  | Ahrons          | 365/229 |
| 3,859,638 | 1/1975  | Hume            | 365/229 |
| 4,122,359 | 10/1978 | Breikss         | 365/229 |
| 4,151,611 | 4/1979  | Sugawara et al. | 365/229 |
| 4,227,257 | 10/1980 | Sato            | 365/229 |

OTHER PUBLICATIONS

Parkinson, PCT/US81/00149, Priority Date 2/8/80.

*Primary Examiner*—Stuart N. Hecker
*Attorney, Agent, or Firm*—Birch, Stewart, Kolasch & Birch

[57] ABSTRACT

A memory protection system includes an auxiliary power supply source for maintaining information stored in a random access memory when the main power supply is terminated. When the main power supply voltage level becomes lower than a preselected level, a detection unit develops a control signal for applying a disabling signal to a chip selection terminal included in the random access memory, whereby a load such as a central processor unit connected to the random access memory is electrically disconnected from the random access memory to minimize the power dissipation.

1 Claim, 2 Drawing Figures

MEMORY PROTECTION SYSTEM

BACKGROUND AND SUMMARY OF THE INVENTION

The present invention relates to a memory protection system and, more particularly, to a system for protecting information stored in a volatile memory when the main power supply is terminated.

Recently, various domestic appliances, such as a microwave oven, have been equipped with a microcomputer control system. The microcomputer microwave oven includes a memory system for storing a sequence of cooking operations optionally programmed by an operator, a housewife. To provide a sufficient memory capacity, a volatile memory, for example, a random access memory (RAM), and a central processor unit (CPU) are employed to store the optional cooking program.

In such a memory system, it is required that the volatile memory be supplied with power even when the main power supply is terminated in order to protect the memorized information. In a conventional system, a rechargeable battery such as a cadmium battery is associated with a power supply circuit so that the random access memory and the central processor unit are supplied with power by the rechargeable battery when the main power supply is interrupted. Since the central processor unit is electrically connected to the random access memory in the conventional system even when the main power supply is interrupted, memory protection is not ensured in case of a long period interruption of the main power supply because the central processor unit consumes a considerably large power.

Accordingly, an object of the present invention is to provide a memory protection system for maintaining information stored in a volatile memory.

Another object of the present invention is to minimize the power dissipation in a memory protection system when the main power supply is interrupted.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from the detailed description.

To achieve the above objects, pursuant to an embodiment of the present invention, a detection unit is provided for developing a control signal when the voltage level of the main power supply becomes lower than a preselected level. In response to the thus developed control signal, a disabling signal is applied to a chip selection terminal of a random access memory, thereby electrically disconnecting a central processor unit from the random access memory. Therefore, only the random access memory is supplied with power from a rechargeable battery when the main power supply is interrupted.

In a preferred form, a Zener diode is associated with a power supply circuit including the rechargeable battery. When the main power supply voltage level becomes lower than the preselected level, the Zener diode is made nonconductive. A transistor is connected to the chip selection terminal to develop an enabling signal in the normal operation mode. When the Zener diode is made nonconductive, the transistor is also made nonconductive to apply the disabling signal to the chip selection terminal of the random access memory.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
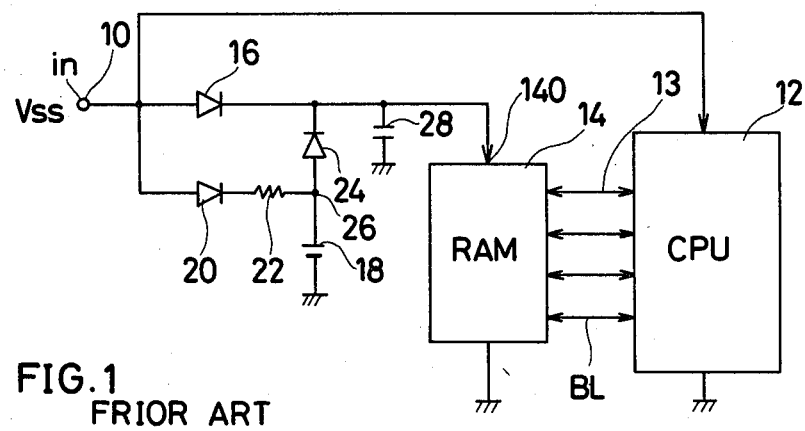
FIG. 1 is a block diagram of a conventional memory protection system.

FIG. 1 shows an example of a conventional memory protection system.

A main power supply terminal 10 supplies a main power $V_{SS}$ to a central processor unit (CPU) 12 and to a random access memory (RAM) 14 via a switching diode 16. An auxiliary power source 18 such as a cadmium rechargeable battery is connected to the main power supply terminal 10 via a switching diode 20 and a resistor 22. In the normal operation mode, the auxiliary power source 18 is charged by the main power $V_{SS}$. A backflow preventing diode 24 is disposed between the cathode terminal of the switching diode 16 and a node 26 formed between the auxiliary power source 18 and the resistor 22.

A capacitor 28 is connected to a power input terminal 140 of the RAM 14 to smooth the power supply switching from the side of the main power supply terminal 10 to the side of the auxiliary power source 18.

In the normal operation mode, the RAM 14 is supplied with the main power $V_{SS}$ through the switching diode 16. Further, the auxiliary power source 18 is charged by the main power $V_{SS}$ via the switching diode 20 and the resistor 22. When the main power supply is interrupted, the auxiliary power source 18 functions to supply power to the RAM 14 through the diode 24. The CPU 12 is electrically connected to the RAM 14 via a bus line 13 even when the main power supply is interrupted and, therefore, the CPU 12 functions as a load connected to the RAM 14. Because of this load, the power consumption at the RAM 14 is considerably large even when the main power supply is interrupted.

Figure 2:
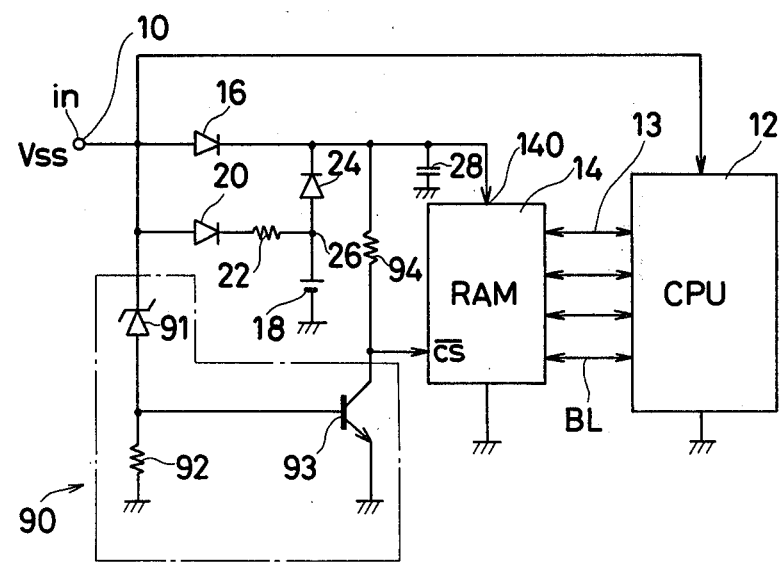
FIG. 2 is a block diagram of an embodiment of a memory protection system of the present invention.

The present invention is to minimize the power dissipation when the RAM 14 is supplied with power from the auxiliary power source 18. FIG. 2 shows an embodiment of a memory protection system of the present invention. Like elements corresponding to those of FIG. 1 are indicated by like numerals.

A control unit 90 is associated with the above-mentioned power supply circuit to detect the voltage level supplied from the main power supply terminal 10. The control unit 90 comprises a Zener diode 91 connected to the main power supply terminal 10, of which Zener voltage is selected slightly lower than the normal voltage level of the main power $V_{SS}$. More specifically, the cathode terminal of the Zener diode 91 is connected to the main power supply terminal 10, and the anode terminal of the Zener diode 91 is grounded through a resistor 92. The anode terminal of the Zener diode 91 is further connected to the base terminal of a transistor 93. The collector terminal of the transistor 93 is connected to a chip selection terminal $\overline{CS}$ of the RAM 14. The collector terminal of the transistor 93 is further connected to the power input terminal 140 of the RAM 14 through a resistor 94. The emitter terminal of the transistor 93 is grounded.

In the normal power supply mode the RAM 14 is supplied with power from the main power supply terminal 10 through the switching diode 6. Further, the auxiliary power source 18 is charged through the switching diode 20 and the resistor 22. The Zener diode 91 is maintained in the conductive condition to provide a current flow across the resistor 92. Under these conditions, the transistor 93 is held in the conductive condition and, therefore, a low level signal is applied to the chip selection terminal $\overline{CS}$ of the RAM 14. The RAM 14 is enabled to perform data write-in operation or read-out operation in accordance with instruction commands derived from the CPU 12.

When the main power supply is accidentally interrupted or when the voltage level of the main power $V_{SS}$ becomes lower than the Zener voltage determined by the Zener diode 91, the Zener diode 91 is made nonconductive. Since the electric current does not flow through the resistor 92, the transistor 93 is made nonconductive. Thus, a high level signal is applied to the chip selection terminal $\overline{CS}$ of the RAM 14 via the resistor 94. The chip selection terminal $\overline{CS}$ is held in the high impedance condition so that the bus line 13 is placed in a condition where the CPU 12 is electrically disconnected from the RAM 14.

Under these conditions, only the RAM 14 is supplied with power from the auxiliary power source 18 for maintaining the information stored in the RAM 14. Accordingly, the power dissipation is minimized when the main power supply is interrupted. A preferred CPU 12 is the CPU SM-3 manufactured by SHARP CORPORATION, or H45A manufactured by HITACHI Ltd. A preferred RAM 14 is the RAM 2114 manufactured by SHARP CORPORATION. A preferred auxiliary power source 18 is a cadmium rechargeable battery.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A memory protection system comprising:
   a volatile memory including a chip selection terminal and an output terminal;
   load means connected to said output terminal of said volatile memory;
   a main power supply terminal for supplying power to said volatile memory and said load means;
   an auxiliary power source for supplying power to said volatile memory when a voltage level derived from said main power supply terminal is lower than a preselected level; and
   voltage level detection means for developing a disabling signal to said chip selection terminal of said volatile memory when the voltage level derived from said main power supply terminal becomes lower than said preselected level, thereby electrically disconnecting said load means from said volatile memory when said volatile memory is supplied with power from said auxiliary power source, said voltage level detection means including,
   a Zener diode connected to said power supply terminal, said Zener diode being placed in a nonconductive condition when the voltage level derived from said main power supply terminal becomes lower than said preselected level;
   a transistor connected to said chip selection terminal of said volatile memory for applying an enabling signal in a normal operation mode; and
   means for placing said transistor in the nonconductive condition when said Zener diode is placed in said nonconductive condition, thereby applying said disabling signal to said chip selection terminal of said volatile memory.

* * * * *